United States Patent [19]

Brownlee et al.

[11] 3,971,389

[45] July 27, 1976

[54] PACEMAKER LOW CURRENT PULSE GENERATOR

[75] Inventors: Robert R. Brownlee, State College; Frank O. Tyers, Hershey; Carl Volz, Sr., State College, all of Pa.

[73] Assignee: Research Company, New York, N.Y.

[22] Filed: June 26, 1975

[21] Appl. No.: 590,409

[52] U.S. Cl. ..................... 128/419 PG; 331/108 A; 331/113 R
[51] Int. Cl.² ............................................. A61N 1/36
[58] Field of Search ..................... 128/419 PG, 422; 331/113 R, 108 A, 176; 328/193

[56] References Cited
UNITED STATES PATENTS

| | | | |
|---|---|---|---|
| 2,901,669 | 8/1959 | Coleman | 331/108 A |
| 3,348,167 | 10/1967 | Gauld | 331/176 |
| 3,378,693 | 4/1968 | Schmidt | 331/111 |
| 3,547,127 | 12/1970 | Anderson | 128/419 PG |
| 3,671,842 | 6/1972 | McKeown | 331/111 |

FOREIGN PATENTS OR APPLICATIONS

| | | | |
|---|---|---|---|
| 1,438,751 | 4/1966 | France | 331/108 A |

*Primary Examiner*—William E. Kamm
*Attorney, Agent, or Firm*—Cooper, Dunham, Clark, Griffin & Moran

[57] ABSTRACT

A low current, low voltage impulse generating system for cardiac pacers using a complementary multivibrator in combination with an RC network which operates in an astable, supply voltage insensitive mode to produce fixed rate pacing pulses.

8 Claims, 7 Drawing Figures

PACEMAKER LOW CURRENT PULSE GENERATOR

BACKGROUND

The present invention involves a low current impulse generating circuit suitable for use in cardiac pacers.

Conventional cardiac pacers or pacemakers utilize suitable low power drain circuits to generate the impulses used for heart stimulation. While additional circuits and circuit components are also provided, one fundamental pulse generating circuit comprises a complementary astable multivibrator, such as disclosed in U.S. Pat. No. 3,717,512, wherein two transistors of opposite conductivity type are connected across a power source and to each other by a plurality of resistors and a condenser. In order to achieve a sufficient stimulation voltage in pacemakers of this type and in view of the undesirable voltage instability of such prior art circuits at low operating potentials, it has generally been necessary to utilize a plurality of cells as the power source with the attendant problems presented thereby. It is accordingly desirable to minimize the voltage instability and power drain of such multivibrator circuits so that long pacemaker life may be achieved while using only a single cell as a power source. The present invention is directed to providing such a multivibrator circuit along with additional circuitry resulting in a highly reliable, low voltage, low power drain, supply voltage insensitive, stable pulse generator.

SUMMARY

The pacing pulse generator of the present invention comprises an astable multivibrator circuit with associated filters and output components which can be operated by means of a single cell power source and which produces supply voltage independent pulses with a minimum of power drain. An RC network is connected between the multivibrator and the respective poles of the power source to satisfy the conditions for astable operation, and an additional transistor is included in the output components, which acts as a power driver for an output step up transformer with a secondary boost feature, as well as a blocking circuit for the multivibrator when the cell voltage drops below a certain value.

DRAWINGS

DETAILED DESCRIPTION

Figure 1:
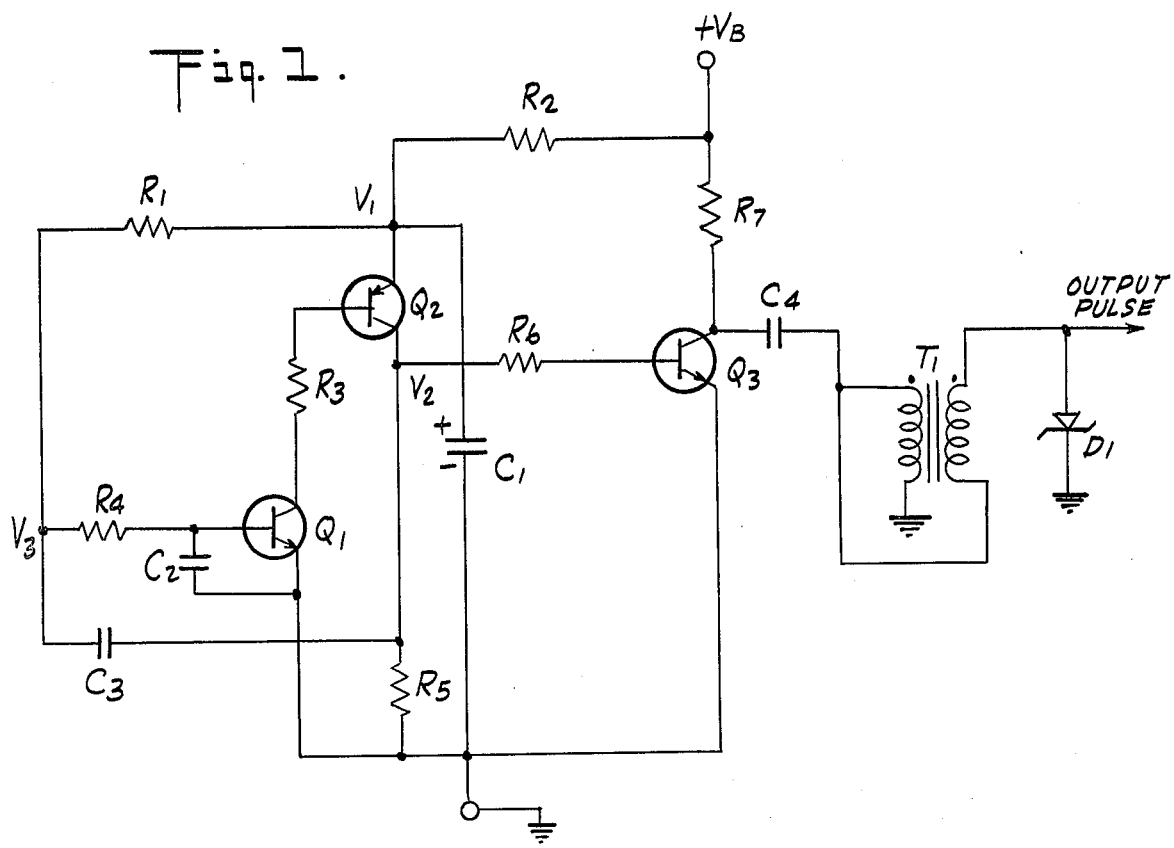
FIG. 1 illustrates a pacing pulse generator circuit in accordance with the present invention.

A pacing pulse generator in accordance with the present invention is shown in FIG. 1 and comprises: a complementary astable multivibrator made up of NPN transistor $Q_1$ and PNP transistor $Q_2$ in combination with resistors $R_1$, $R_2$, $R_3$ and $R_5$ and condensers $C_1$ and $C_3$; cooperating filter network $R_4$, $C_2$; and output components $R_6$, $R_7$, $C_4$ and NPN transistor $Q_3$. The emitter of transistor $Q_2$ is connected through the resistor $R_2$ to the positive pole of the pacemaker battery. The collector of transistor $Q_2$ is connected through the resistor $R_5$ to a source of reference potential such as the negative pole of the battery, and is also connected through condenser $C_3$ and resistor $R_4$ with the base of transistor $Q_1$. The emitter of transistor $Q_1$ is directly connected to the negative pole of the battery while its collector is connected with the base of transistor $Q_2$ through resistor $R_3$. The base of transistor $Q_1$ is connected to the positive pole of the battery through resistors $R_4$, $R_1$ and $R_2$.

To achieve an astable state with the circuit, component values must be selected that create steady state contradictory operating conditions as follows. When transistors $Q_1$ and $Q_2$ are in the "on" state, loading at resistor $R_2$ by all pertinent circuit components must become sufficient to reduce the voltage $v_1$ at the emitter of transistor $Q_2$ to less than the "on" requirements of the emitter-base junction of transistor $Q_1$, thus cutting off conduction of both the transistors. Conversely, with transistors $Q_1$ and $Q_2$ in the "off" state, the voltage $V_1$ at the emitter of transistor $Q_2$ must become sufficiently large to supply "on" base current via resistor $R_1$ to the base of transistor $Q_1$, thus causing both transistors to conduct. These contradictory conditions are dynamically produced under oscillatory conditions by energy storage on condensers $C_1$ and $C_3$.

By way of further explanation of the operation of the oscillatory sequence, consider that just prior to the "on" condition, the voltage $V_1$ on condenser $C_1$ attains a value approximating the battery voltage $V_B$, and condenser $C_3$ is charged through resistor $R_1$ to a voltage $V_3$ approaching the "on" requirements of transistor $Q_1$, and therefore the "on" requirements of transistor $Q_2$ through resistor $R_3$. Transistors $Q_1$ and $Q_2$ then begin to conduct and just after the transition to the "on" condition, the voltage $V_2$ at the collector of transistor $Q_2$ jumps to a value approximating the voltage $V_1$ through conduction to saturation of transistor $Q_2$. Saturation conduction is ensured by the added base drive supplied by the positive feed-back via condenser $C_3$ as voltage $V_2$ increases toward voltage $V_1$. During the "on" period, discharge of condenser $C_3$ supplies base drive to transistor $Q_1$ through resistor $R_4$. Simultaneous with the discharge of condenser $C_3$, condenser $C_1$ is also discharging to a value dependent on the circuit loading at resistor $R_2$.

When the base drive of transistor $Q_1$ is depleted by decay of the charge on condenser $C_3$ and there is an insufficiency of base drive current via resistor $R_1$ because of the decay of voltage $V_1$, the resultant loss of saturation of transistor $Q_2$ creates the condition to ensure a reversal to the "off" state. More particularly, a drop in voltage $V_2$ because of a loss of saturation of transistor $Q_2$ and the lowered level of voltage $V_1$ results in a rapid transition to the "off" state by way of the positive feedback through condenser $C_3$. In the "off" state, condenser $C_1$ begins to charge toward voltage $V_B$ and the voltage on condenser $C_3$ begins to charge toward voltage $V_1$ through resistor $R_1$. When the voltage across condenser $C_3$ then reaches a voltage $V_3$ sufficient to turn transistors $Q_1$ and $Q_2$ back "on" the cycle is repeated and continues producing a pulsed output across resistor $R_5$.

It will be seen that with resistor $R_2$ and condenser $C_1$ removed, the circuit is a monostable device with an externally triggered pulse interval which is relatively independent of supply voltage and which has a triggered "off" interval time that can be expressed as $t \simeq 0.7\ R_1C_3$. The inclusion of network $R_2C_1$ provides an astable mode with a free running "off" interval time similarly independent of supply voltage and principally dependent on $R_1C_3$ but also influenced by $R_2C_1$ in a proportionate measured relationship $\Delta t \simeq 0.15\Delta(R_2C_1)$.

The impulses generated by the multivibrator occurring across resistor $R_5$ are supplied to an output amplifier stage which comprises NPN transistor $Q_3$ and series resistor $R_6$. The output of transistor $Q_3$ drives a suitable step-up transformer $T_1$ through condenser $C_4$. A secondary boost is obtained by cross-connecting the transformer windings in autotransformer fashion so that the pulse generated on the collector of transistor $Q_3$ is added to the output.

Figure 2:
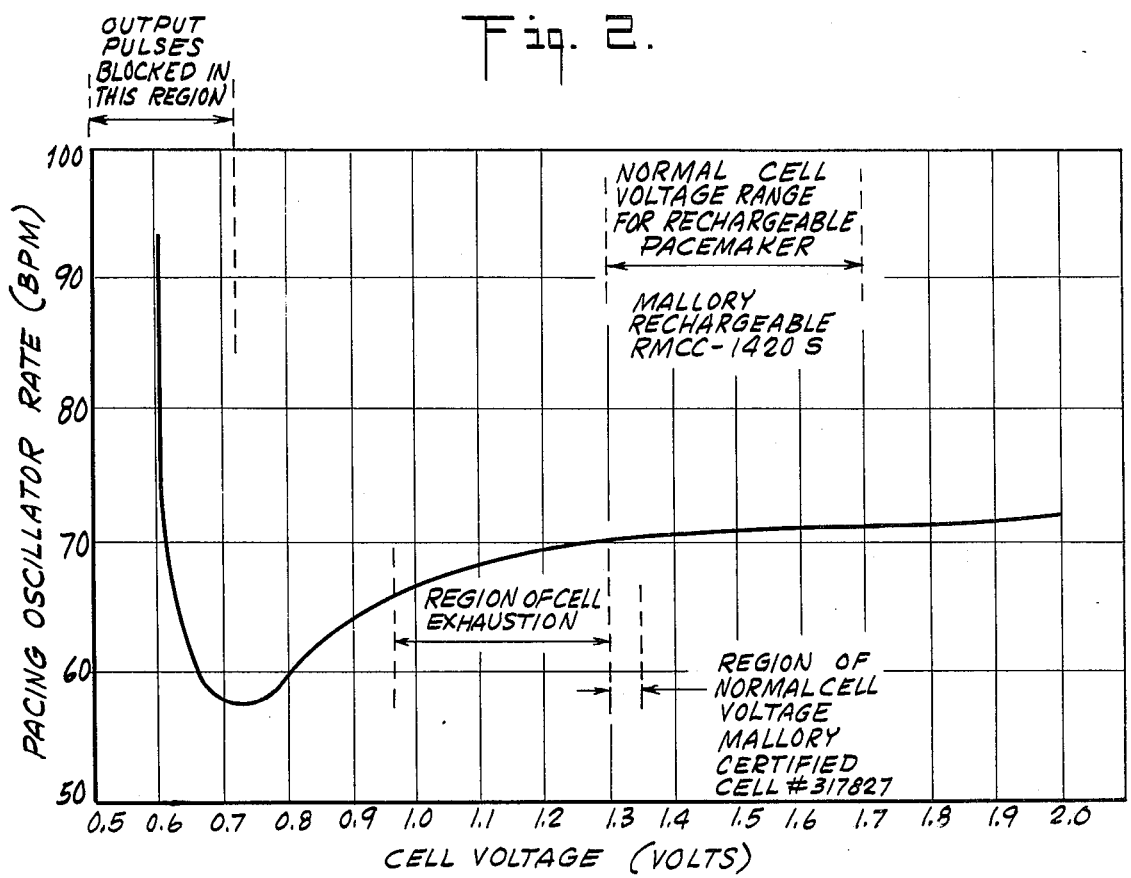
FIG. 2 is a plot of the pacer pulse rate in beats per minute versus the battery output voltage in volts.

Transistor $Q_3$ and its associated components comprise the power driver for the transformer and also act as a blocking circuit when the cell voltage drops below a certain value. For example, at low cell voltages such as below 0.7 volts, the pulse level from the collector of $Q_2$ is insufficient to drive the base of $Q_3$ so pacing output pulses cease in this voltage range. The importance of this blocking function will be appreciated upon reference to FIG. 2 which is a plot of the pacer pulse rate in beats per minute versus the battery output voltage in volts. It will be seen that in the normal operating range of both rechargeable and non-rechargeable cells, the pulse rate remains in the vicinity of 70 beats per minute. However, in the range below 1 volt down to about 0.7 volts output the beats per minute drop off rapidly and then with further decrease in battery voltage output the pulse rate increases very rapidly to the point of running away. Thus, the use of transistor $Q_3$ for blocking the pulse generator output below 0.7 volts prevents this runaway pulse rate from being communicated to the pacer output. It will also be seen that cell depletion should be noted prior to a cessation of pacing in the region where the rate slows as the cell voltage decreases. It has also been found that temperature changes will alter the rate in the range of +0.25 to 0.3 BPM per °F at a 70 BPM nominal rate. The temperature coefficient is therefore less than +0.5% per °F and quite acceptable for pacemaker use. Patient fever, for example, would simply increase the pacing rate slightly.

Figure 3:
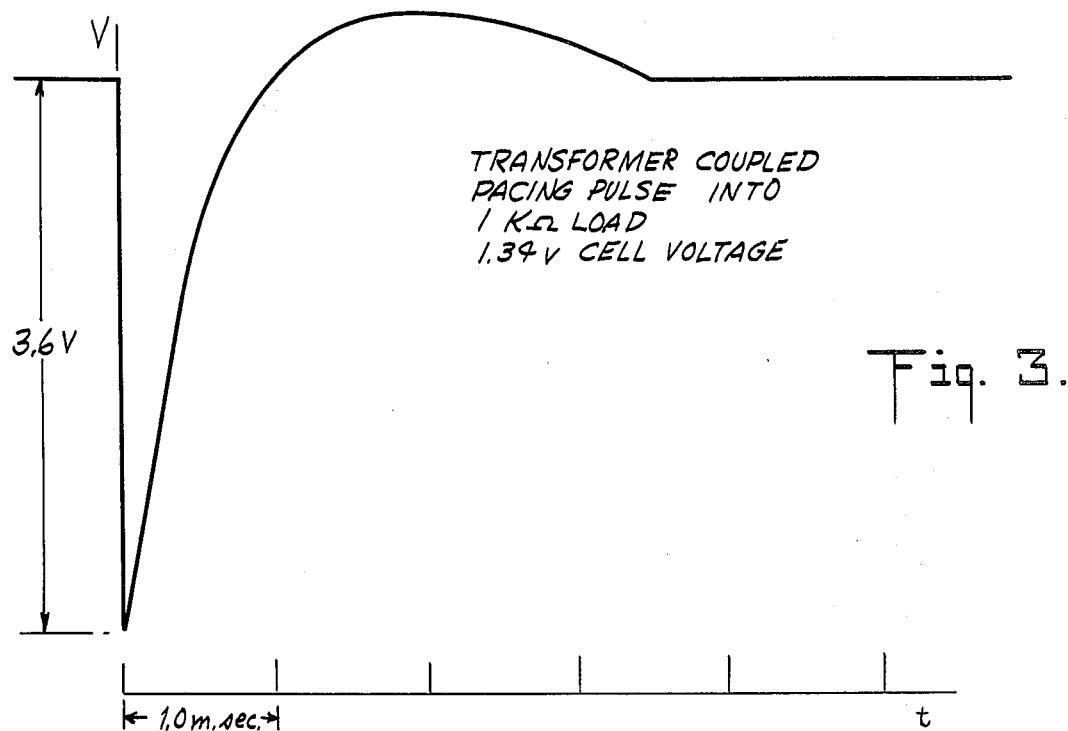
FIG. 3 illustrates the form of the output pulse produced by the pulse generator of the present invention.

In normal operation an output pulse of the form shown in FIG. 3 is developed by dumping the charge on condenser $C_4$ into the primary winding of transformer $T_1$. Condenser $C_4$ in the output circuit is charged to the supply voltage through resistor $R_7$ during the interval between pulses and is then discharged rapidly through transistor $Q_3$ and the transformer primary when a base drive pulse is applied to $Q_3$ from the astable circuit. The output pulse is a combination of the transformed pulse plus the boost pulse received from the primary circuit. A pulse of the form of FIG. 3 occurs in a resistive load at the output of transformer $T_1$. FIG. 3 particularly illustrates the form of a transformer coupled pacing pulse resulting from the use of a 1.34 volt cell voltage and into a 1,000 ohm load. It will be seen that the peak output voltage is about 3.6 volts and the pulse period is about 1.0 millisecond. The output pulse shape is determined principally by the transformer and load characteristics for large capacity values of condenser $C_4$. The capacity of condenser $C_4$ should be made as small as possible but consistent with not degrading the output pulse energy. Higher output energizes may be obtained by employing a larger transformer core size as well as using higher cell potentials such as achievable with a lithium power cell.

Figure 1A:
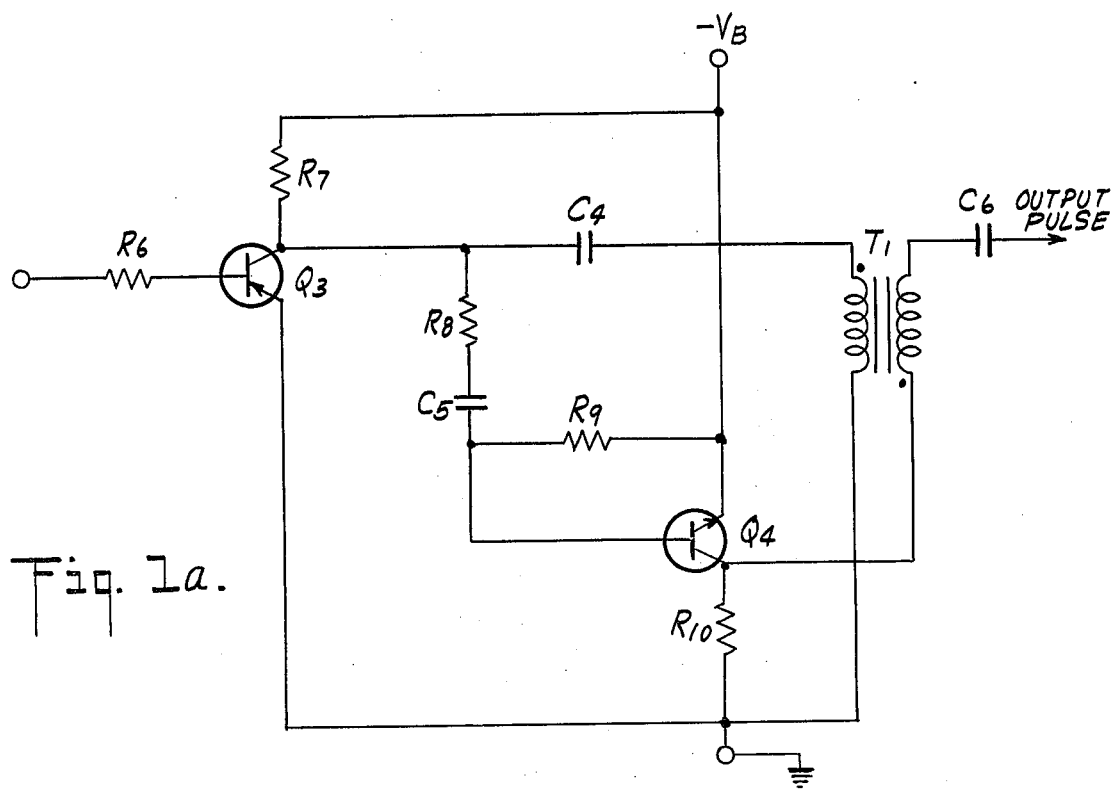
FIG. 1(a) illustrates an alternate transformer secondary boost pulse network for use with the circuit of FIG. 1 when modified to operate with reversed polarity.

The output of transformer $T_1$ may be grounded through a Zener diode $D_1$ to protect against defibrillators. Alternatively, a transformer secondary boost pulse network may also be included, as shown in FIG. 1(a) when using the circuit of FIG. 1 with reversed polarity. The circuit elements would be appropriately modified, for example, transistor $Q_3$ would be of the PNP type, and the boost network comprising resistors $R_8$ and $R_9$ and condenser $C_5$ in combination with NPN transistor $Q_4$ and output resistor $R_{10}$ is connected between the collector of transistor $Q_3$ and the positive pole. The output of transformer $T_1$, in either event, may be connected through a condenser $C_6$ to a conductor leading to the ventricular heart electrode.

Figure 4:
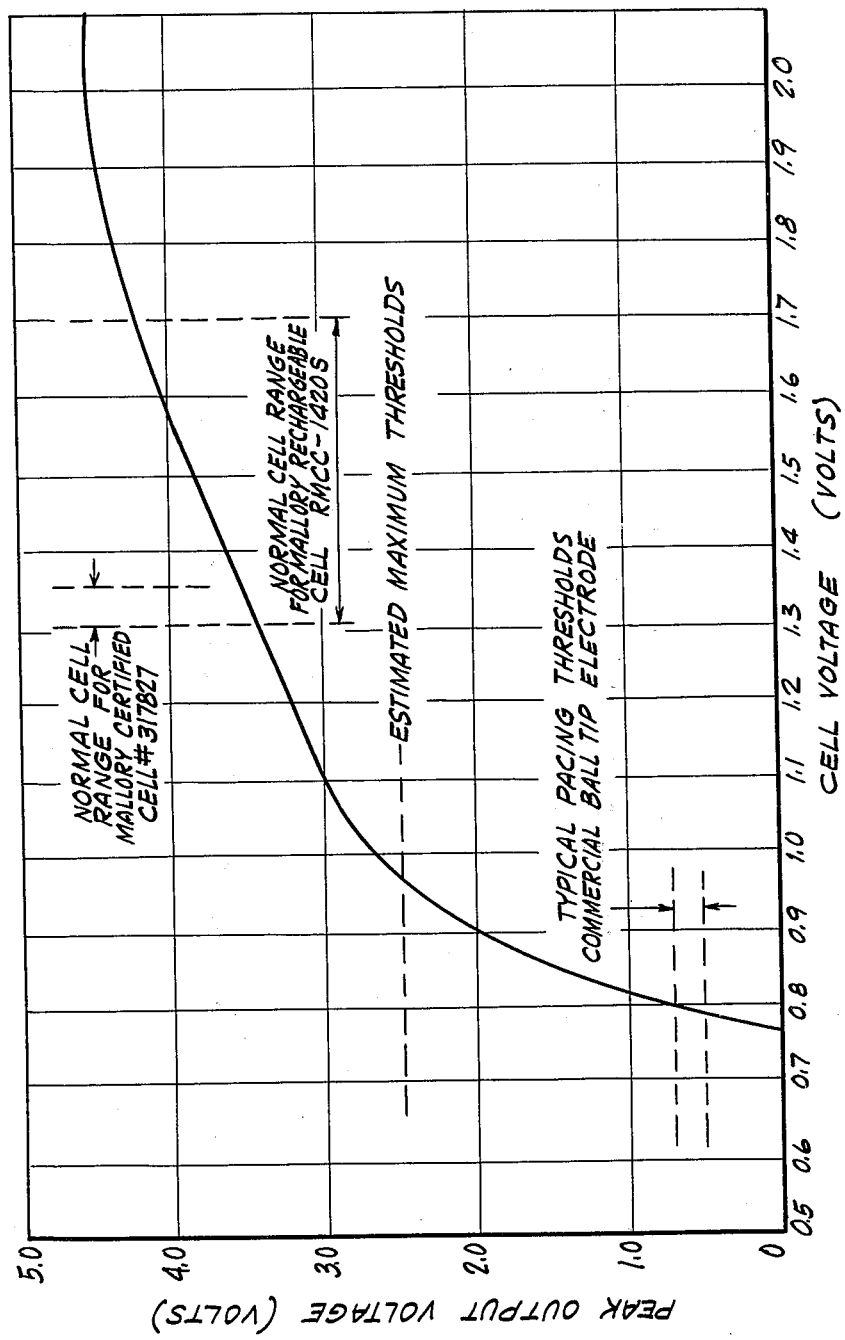
FIG. 4 is a plot of the generator peak output voltage in volts versus the battery output voltage in volts using a 1,000 ohm load.
Figure 5:
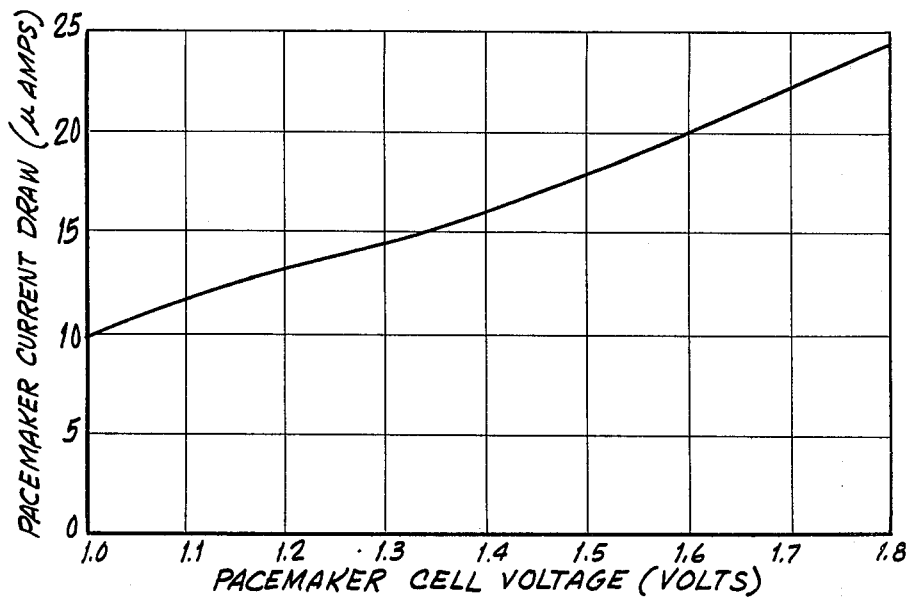
FIG. 5 is a plot of the current drawn by the pulse generator of the present invention in microamperes as a function of cell voltage in volts.
Figure 6:
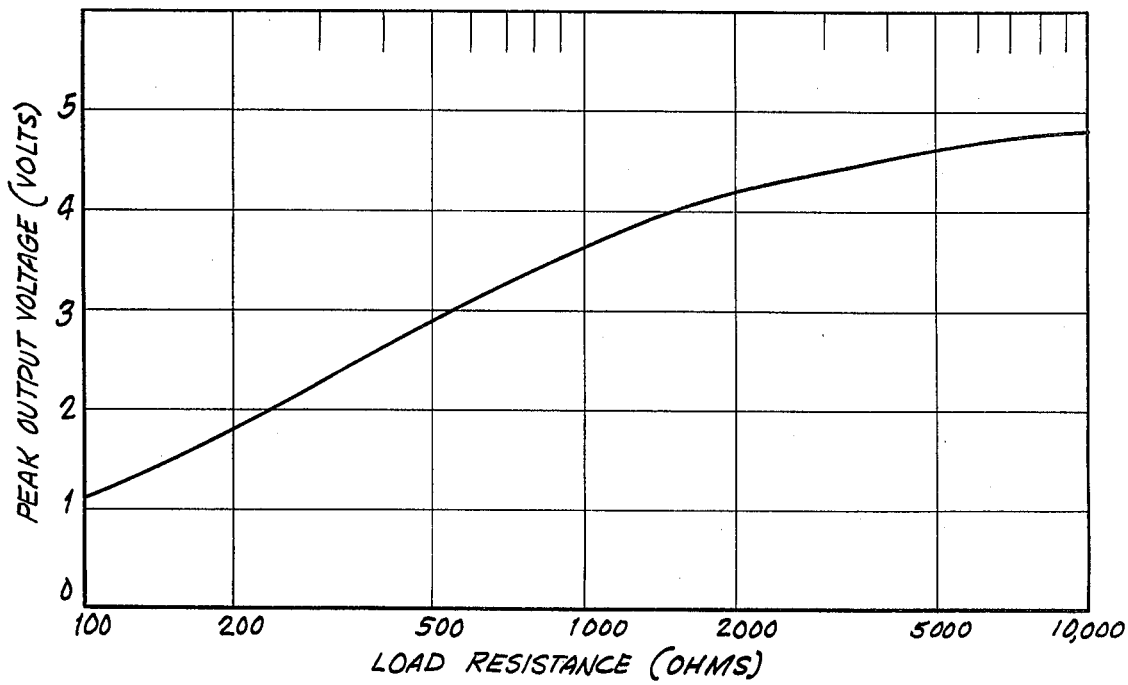
FIG. 6 is a plot of the variation of peak output voltage in volts for a range of load resistors varying between 100 and 5,000 ohms.

Further performance characteristics for a pulse generator circuit in accordance with the present invention are shown in FIGS. 4–6. The plots shown in these figures were obtained using a preferred embodiment of the circuit utilizing the approximate component values as follows:

| Resistors | Condensers |
|---|---|
| $R_1 = 1$ megohm | $C_1 = 1.0$ microfarad |
| $R_2 = 22$ K ohm | $C_2 = 0.2$ microfarad |
| $R_3 = 22$ K ohm | $C_3 = 6.8$ microfarads |
| $R_4 = 1$ K ohm | $C_4 = 6.8$ microfarads |
| $R_5 = 22$ K ohm | |
| $R_6 = 1$ K ohm | |
| $R_7 = 22$ K ohm | |

These component values are exemplary and may be varied to achieve lower currents at higher cell potentials, such as when employing a lithium power cell.

FIG. 4 is a plot of the generator peak output voltage in volts versus the battery output voltage in volts using a 1,000 ohm load, and shows the dependence of the peak output pacing pulse amplitude into a 1,000 ohm load as a function of the cell voltage. Clinical experience with ball-tipped small surface area electrodes indicates that typical pacing thresholds for the waveform utilized (see FIG. 3) are in the vicinity of 0.5 V to 0.7 V and 0.5 ma to 0.7 ma. Thus, with impedance levels in the range of 1,000 ohms, the typical energy threshold levels are less than 1 microjoule. Higher thresholds have been encountered but it is estimated that 2.5 V and 2.5 ma (in the region of 3–4 microjoules) represent acceptable absolute maximums for design purposes. If this maximum is exceeded in an individual rare case, it is justified to be called the exception to be dealt with by electrode relocation or by use of a special pacemaker for the rare high-threshold patient. The advantages of reduced pulse power output to the majority of normal threshold pacemaker patients with respect to extended pacer lifetime and/or reduction in pacemaker size is apparent even though high output units may be required for the occasional exception (myocarditis). FIG. 6 shows the variation of peak output voltage in volts for a range of load resistors varying between 100 and 5,000 ohms.

FIG. 5 illustrates the current drain in microamperes as a function of cell voltage in volts. It will be seen that at the normal operating voltage of 1.34 volts the current drain is about 16 microamps representing a power consumption of 21.4 microwatts. This amounts to less than half the power consumption of many present commercially available pacemaker models. It will be seen that the present invention provides output pulse levels of the order of 4.0 volts with a load impedance of 1,000 ohms and functions well down to supply voltage levels of 1.0 volt while being quite stable in period between normal cell voltages of 1.3 to 1.6 volts. With an average 16 microamperes drain from the cell a pacer lifetime in excess of 7 years/amp. hr. true cell capacity is indicated.

Suitable cells for use with the present invention include the standard Mallory 1.5 volt Certified Cell No. 317827 and the Mallory Rechargeable Cell RMCC-1420S. A single lithium power cell, e.g., an Electrochimica L-2 cell, has also been found suitable but requires adjustment of certain of the circuit component values as previously noted. A pacer lifetime of greater than 12 years is indicated with such a lithium cell.

It will thus be seen that the present invention provides a low drain single cell pacing oscillator or pulse generator which may be used in pacemakers having rechargeable and non-rechargeable batteries. It is also contemplated that the present pulse generator is suitable for use in many applications other than in pacers such as in nerve and muscle stimulators, and the like.

In the event that a means for determining battery depletion is required to be incorporated in the circuit, it is contemplated that an additional resistor be placed in series with condenser $C_3$ to increase the sensitivity of the output rate to voltage changes when a non-rechargeable cell such as a lithium cell is used as the power source.

We claim:

1. A pulse generating system for incorporation in a cardiac pacer or the like comprising:
   a power cell having a first pole and a second pole with a difference of potential between them;
   a first transistor;
   a first resistor inserted between the collector of said first transistor and the second pole of said power cell;
   a second transistor of a conductivity type opposite to that of said first transistor and having its emitter connected directly to said second pole;
   a second resistor inserted between the base of said first transistor and the collector of said second transistor;
   a third resistor inserted between the base of said second transistor and the emitter of said first transistor;
   a first condenser inserted between the base of said second transistor and the collector of said first transistor;
   a fourth resistor inserted between said first pole of said power cell and the emitter of said first transistor;
   a second condenser having one side connected with said second pole and the opposite side directly connected to the junction between said fourth resistor and the emitter of said first transistor; and
   means connected to the collector of said first transistor for conducting output pulses.

2. A system as in claim 1 wherein said output pulse conducting means comprises:
   a fifth resistor connected to the collector of said first transistor;
   a third transistor of a conductivity type opposite to that of said first transistor and having its base directly connected to said fifth resistor and its emitter connected with the second pole of said power cell; and
   means directly connected to the collector of said third transistor for transferring said output pulses.

3. A system as in claim 2 wherein said output pulse transferring means comprises a transformer having primary and secondary windings; a third condenser inserted between the collector of said third transistor and said primary winding; and a sixth resistor connected between said first pole of said power cell and the collector of said third transistor.

4. A system as in claim 3 wherein said primary winding has one side connected to the second pole of said power cell and the other side connected to said third condenser and said secondary winding.

5. A system of claim 3 further comprising: a fourth transistor of a conductivity type opposite to that of said third transistor and having its collector connected with said secondary winding and its emitter connected with said first pole of said power cell; a seventh resistor inserted between the collector of said fourth transistor and said second pole; an eighth resistor and a fourth condenser inserted in series between the collector of said third transistor and the base of said fourth transistor; and a ninth resistor inserted between the base of said fourth transistor and its emitter.

6. A system as in claim 1 further comprising: a sixth resistor inserted between said first condenser and the base of said second transistor; and a third condenser inserted between said second pole of said power cell and the base of said second transistor.

7. Apparatus for providing a continuous train of electrical output pulses whose timing is insensitive to variations in the voltage of its power source comprising:
   a first transistor and a second transistor of opposite polarity types;
   first means for connecting the base of said first transistor to the collector of said second transistor;
   second means for connecting the emitter of said first transistor to the base of said second transistor;
   third means for connecting the collector of said first transistor to the emitter of said second transistor and to one pole of the power source;
   fourth means for connecting the emitter of said first transistor to said one pole of the power source;
   fifth means for connecting the emitter of said first transistor to the other pole of said power source;
   sixth means for connecting the collector of said first transistor to the base of said second transistor;
   seventh means connected to the collector of said first transistor for conducting said electrical output pulses; and
   wherein said first, second, third, fifth and seventh means comprises resistances and said fourth and sixth means comprise condensers.

8. Apparatus as in claim 7 wherein said seventh means comprises a third transistor of opposite polarity type from that of said first transistor.

* * * * *

UNITED STATES PATENT AND TRADEMARK OFFICE
CERTIFICATE OF CORRECTION

PATENT NO. : 3,971,389
DATED : July 27, 1976
INVENTOR(S) : ROBERT R. BROWNLEE, G. FRANK O. TYERS & CARL VOLZ, SR.

It is certified that error appears in the above-identified patent and that said Letters Patent are hereby corrected as shown below:

Cover Page, Item [75], line 2, "Frank O. Tyers" should read

--G. Frank O. Tyers--;

Item [73], "Research Company" should read

--Research Corporation--;

Col. 4, line 8, "energizes" should read --energies--;

Claim 5, line 1, "of" should read --as in--.

Signed and Sealed this

Twenty-first Day of September 1976

[SEAL]

Attest:

RUTH C. MASON
Attesting Officer

C. MARSHALL DANN
Commissioner of Patents and Trademarks